United States Patent
Ho et al.

(10) Patent No.: US 6,383,005 B2
(45) Date of Patent: May 7, 2002

(54) INTEGRATED CIRCUIT SOCKET WITH CONTACT PAD

(75) Inventors: Han-Shin Ho, Hsinchu Hsien; Wei-Hai Lai; Chien-Shuan Kuo, both of Hsinchu; Deng-Tswen Shieh, Kaohsiung; Ming-Hsien Wang, Taipei; Chin-Ting Whung, Hsinchu Hsien, all of (TW)

(73) Assignee: Urex Precision, Inc., Taipei (TW)

( * ) Notice: Subject to any disclaimer, the term of this patent is extended or adjusted under 35 U.S.C. 154(b) by 0 days.

(21) Appl. No.: 09/826,499

(22) Filed: Apr. 5, 2001

Related U.S. Application Data

(63) Continuation-in-part of application No. 09/454,550, filed on Dec. 7, 1999.

(51) Int. Cl.[7] .............................................. H01R 13/62
(52) U.S. Cl. ........................... 439/331; 439/77; 439/83
(58) Field of Search ............................... 439/330–331, 439/66–73, 77, 525, 526, 83

(56) References Cited

U.S. PATENT DOCUMENTS

| | | | | | |
|---|---|---|---|---|---|
| 6,152,744 A | * | 11/1960 | Maeda | .......................... | 439/71 |
| 5,397,245 A | * | 3/1995 | Roebuck et al. | ............. | 439/264 |
| 5,409,392 A | * | 4/1995 | Marks et al. | ................ | 439/266 |
| 5,499,929 A | * | 3/1996 | Miyazawa | ................... | 439/331 |
| 5,880,590 A | * | 3/1999 | Desai et al. | .................... | 439/66 |
| 5,908,324 A | * | 6/1999 | Ohshima et al. | ............. | 439/266 |
| 6,033,235 A | * | 3/2000 | Ikeya | ........................... | 439/71 |
| 6,062,873 A | * | 5/2000 | Kate | ............................ | 439/66 |

* cited by examiner

*Primary Examiner*—Khiem Nguyen
(74) *Attorney, Agent, or Firm*—Powell, Goldstein, Frazer & Murphy, LLP

(57) ABSTRACT

An integrated circuit socket having a contact pad is disclosed. The integrated circuit socket comprises the following components. (1) A base unit, consisting of a base, contact pins and an elastomer. The contact pins will provide the electrical contact of the other elements, the elastomer provides the compactness of the assembly. (2) An interposer, comprising flexible film, a stiffener and a stop layer wherein the contact pad of the flexible film may contact with the solder ball of IC device to buffer the pressure formed by a tight contact when IC device is moving downward. The pressure will be dispersed with the flexible film such that the testing signals are transmitted. (3) An adapter unit, capable of positioning the integrated circuit device and includes a depressor to suppress or release the integrated circuit. (4) A cover unit is located over the base, the interposer and the adapter unit, and including a cover and a spring such that the cover is coupled to the depressor of the adapter unit and being capable of vertically moving up and down.

13 Claims, 6 Drawing Sheets

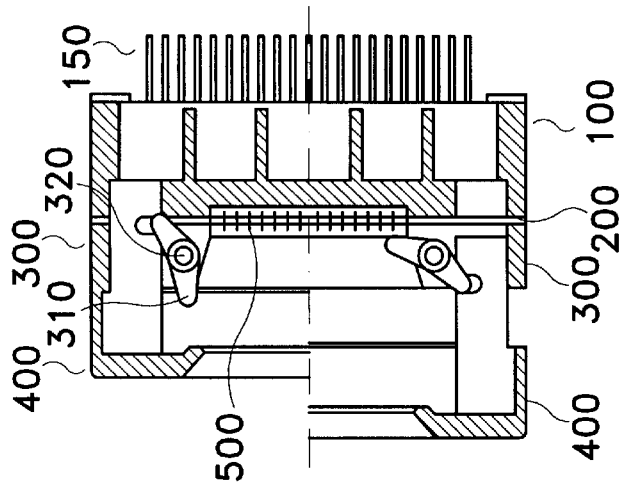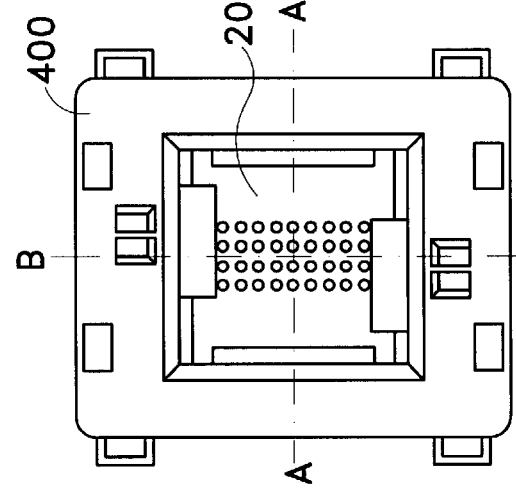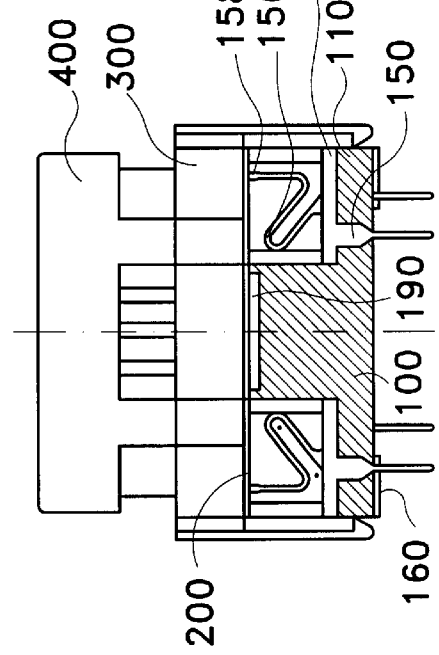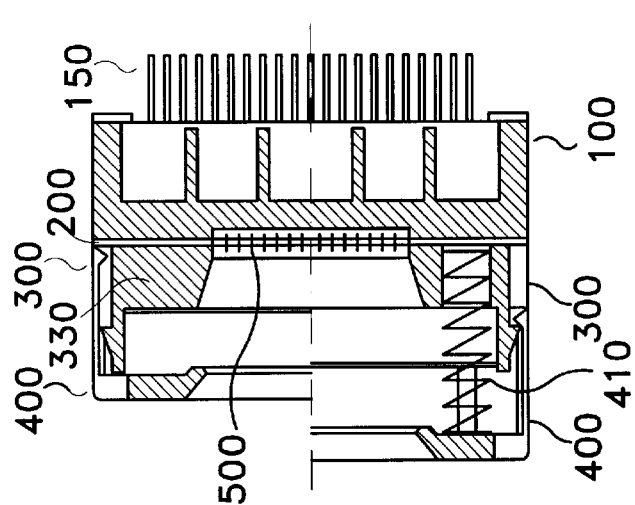

INTEGRATED CIRCUIT SOCKET WITH CONTACT PAD

This is a continuation-in-part of U.S. patent application Ser. No. 09/454,550, filed Dec. 7, 1999.

FIELD OF THE INVENTION

The present invention relates to an integrated circuit socket, and more particularly, to an integrated circuit socket with a contact pad.

BACKGROUND OF THE INVENTION

With the rapid development of the semiconductor industry in which the density of integrated circuits (ICs) has gradually become higher, the gate length has been decreased to sub-micron range, even to the deep sub-micron. Nevertheless, the lifetime of products has become much shorter. Since the variable requirement with IC devices also has increased, there are products with different functions, sizes, and pin assignments.

In the processing steps of semiconductor devices, there are many test procedures after IC devices are created to ensure the functionality and quality of the IC devices. For example, these test procedures of an IC chip may include an examination of lead frame, power consumption, the basic logic analysis, the output impedance measurement and the "Burn-in" test. The basic hardware configuration of these test procedures is to use a socket or a connector to locate the IC chip.

The conventional connector of the IC chip, such as logic circuits for central processing unit (CPU) or memory unit, is all with specific usage and pin assignment. As the IC chip is in a "burn-in test", conventional sockets are designed for a specific kind of an IC chip. A clamping structure in the socket is used to fix the IC chip and conduct it for testing. Since the conventional clamping structure is designed for pin contact, the way may get the surface of the solder balls pierced, which is harmful to solder balls and results in the damage of the solder balls. Testing current circulating among the contact interface is blocked with ease, causing high contact resistance values so that the whole electrical contact of the IC chip is obviously degraded.

Therefore, the contact interface must be kept in a good electrical contact to form a preferred contact region between solder balls and contact pad, making current circulate easily, that is to say IC chip must to be exactly located in the contact pad. However, the conventional pin contact is apparently disadvantageous to circulation of current since the contact region is too smaller. Further, a none damage zone (NDZ) is defined as an essential contact region where is used to solder IC chip with the printed circuit board (PCB). The good condition of the NDZ, including geometric shape and electrical property, needs to be held all the time during IC testing so as to contribute to exactly solder NDZ with the PCB after the IC chip is completely tested.

SUMMARY OF THE INVENTION

In view of the foregoing regarding the conventional integrated circuit (IC) socket, there have been various problems all the time. The primary object of the present invention is to provide an integrated circuit socket with a contact pad.

According to the main object, the present invention offers an integrated circuit socket with a contact pad, wherein the contact pad comprises:

(1) A base unit which further includes a base, a contact pin and an elastomer wherein the elastomer is located at the upper portion of the base and the contact pin is fastened inside a recessed portion of the base.

(2) An interposer which further includes contact pads, conductive wires, pads, a flexible film, a stiffener, a stop layer and positioning holes. These positioning holes are used to match up with the base unit in order to assemble exactly the IC socket by dowel. In operation, the contact pads, located on the center of the interposer, are contact with the solder balls of the IC device. Electrical signals are transmitted from the IC device to the contact pads, and then pass through the coupling conductive wire to the pads, finally come over the contact portion of the contact pin to the circuits of the PCB.

(3) An adapter unit, which includes an adapter and a depressor, is placed on the base unit and the interposer and the adapter unit provides the positioning function of IC device and the depressor can suppress or release the IC device.

(4) A cover unit which is located over the base, the interposer and the adapter unit, and includes a cover and a spring such that the cover is coupled to the depressor of the adapter unit and is capable of vertically moving up and down.

According to the present invention, the contact type between the solder ball and the contact pad provides a preferred protection and also does not tend to contribute to deformation resulting in an ineffective electrical contact. Further, the electrical contact is better since the contact type between the solder ball and the contact pad is line or surface contact in partial region. Furthermore, a NDZ can be readily kept in a good condition so as to form a preferred contact interface and the deformation of the solder ball is smaller than that of the conventional pin contact.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A~2D are three views of the IC socket comprising the modules-assembled according to the present invention;

DETAILED DESCRIPTION OF THE PREFERRED EMBODIMENT

Figure 1:
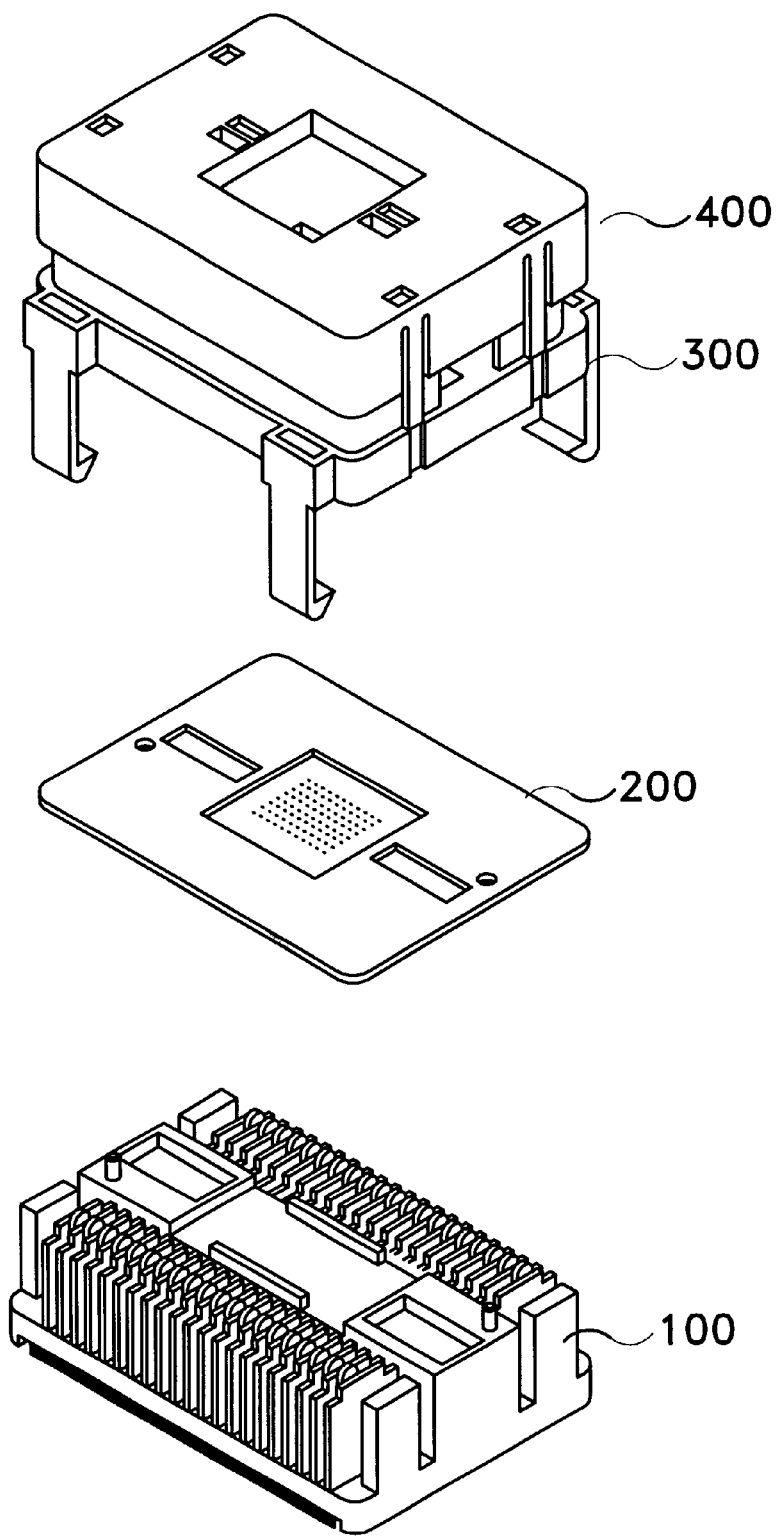
FIG. 1 is an exploded perspective drawing of a IC socket according to the present invention.

Referring now to FIG. 1, this figure shows an exploded perspective drawing of an IC socket. The IC socket module in this figure is the base unit 100, the interposer 200, the adapter unit 300 and the cover unit 400. The base unit 100 is a housing with contact pins welded on a printing circuit board (not shown in the figure). Next, the interposer 200 is a material with contact pads and conductive wires connected electrically thereon. Then, the adapter unit 300 is a device with clasps to fasten the whole IC socket. Finally, the cover unit 400 is used for suppressing or releasing the IC device.

Referring to FIGS. 2A~2D, three different views of the IC socket comprising the modules-assembled are shown. FIG. 2A is a vertical view of the IC socket, and FIG. 2D is a cross-sectional view at line AA in FIG. 2A, the FIGS. 2B and 2C are cross-sectional views at line BB in FIG. 2A. For better understanding of the drawings, wherein the interposer 200 is the significant characteristic of the present invention, the primary four devices of the IC socket are described as follows:

(1) The base unit 100: In FIG. 2D, the base unit 100 comprises a base 110, contact pins (150, 160) and an elastomer 190. There are recessed regions in the base 110 to support the contact pins (150, 160) and the elastomer 190. The elastomer 190 is located on the upper portion of the base 110 with a good compressibility and elasticity. Due to the elastic effect of the elastomer 190, the IC device under test and the interposer 200 will be closely connected to the base unit 100 the whole IC socket is assembled, therefore enhancing the electrical contact between different elements.

Still referring to FIG. 2D, the interposer 200 is rigidly close to the base 110 having the elastomer 190 in-between. The fastened contact pin 150 in the base 110 is used to electrically connect the upper interposer 200 and the underneath printed circuit board (not shown in the figure). The stationary portion 154 of the contact pin 150 is located in the recession of the base 110 as shown in the figure. The central part of the contact pin 150 is a U shape cantilever 156 and a contact portion 158. The contact pin 156 provides a good flexibility due to the specific configuration of the U shape cantilever 156. Therefore, when the interposer 200 and the base unit 100 are assembled together, the contact portion 158 of the contact pin is connected to the interposer 200 and keeps a good electrical contact owing to the U shape cantilever 156.

Figure 3:
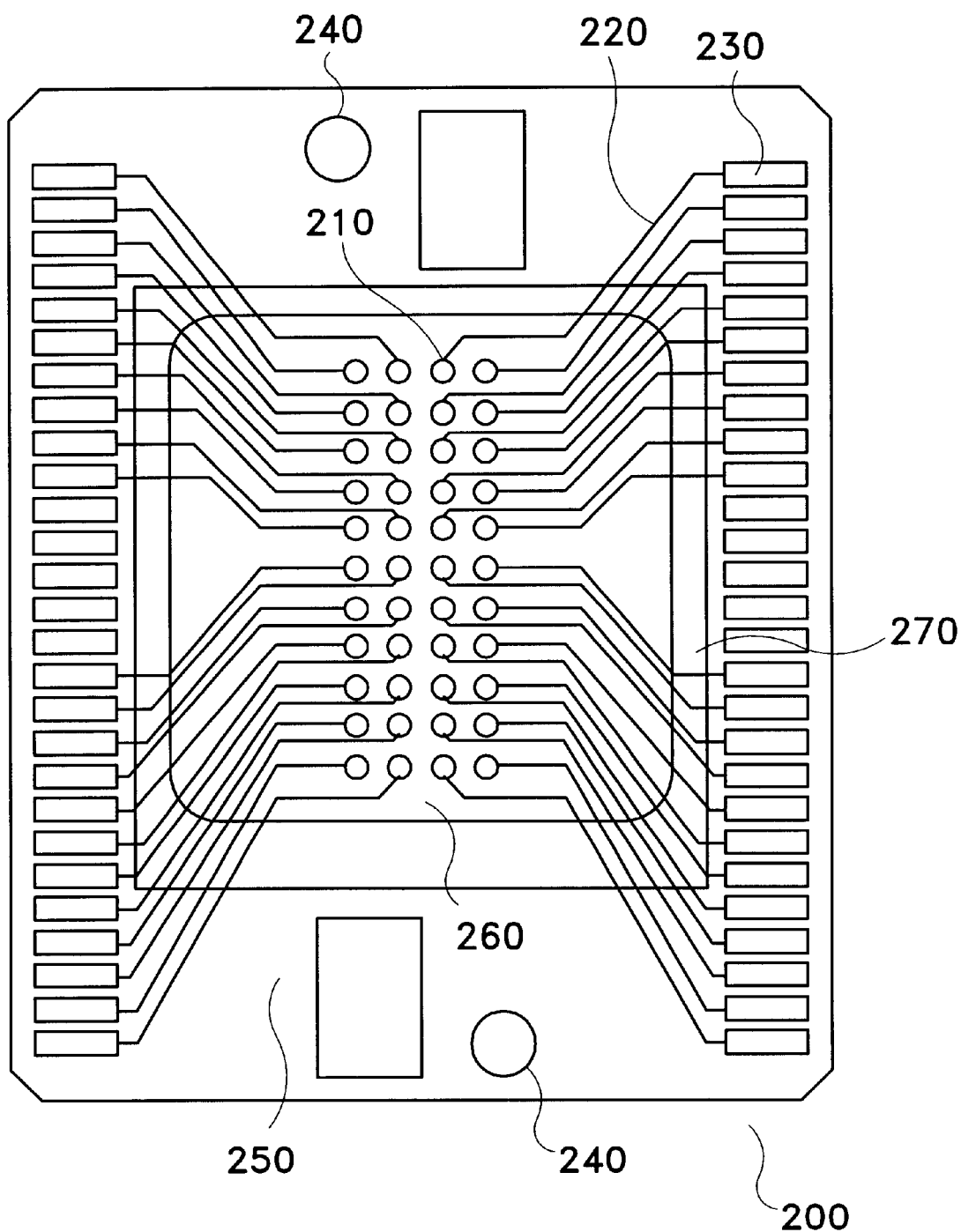
FIG. 3 is a front view of the interposer according to the present invention.

(2) The interposer 200: Referring to FIG. 3, the figure is a front view of the interposer 200. The interposer 200 includes contact pads 210, conductive wires 220, pads 230, a flexible film 260, a stiffener 250, a stop layer 270 and positioning holes 240. These positioning holes 240 are used to match up with the base unit 100 in order to assemble exactly the IC socket by dowel. In operation, the contact pads 210, located on the center of the interposer 200, are contact with solder balls of the IC chip. Electrical signals are transmitted from the IC chip to the contact pads 210, and then pass through the coupling conductive wires 220 to the pads 230, finally come over the contact portion of the contact pin (150, 156) to the circuits of the PCB.

Figure 4:
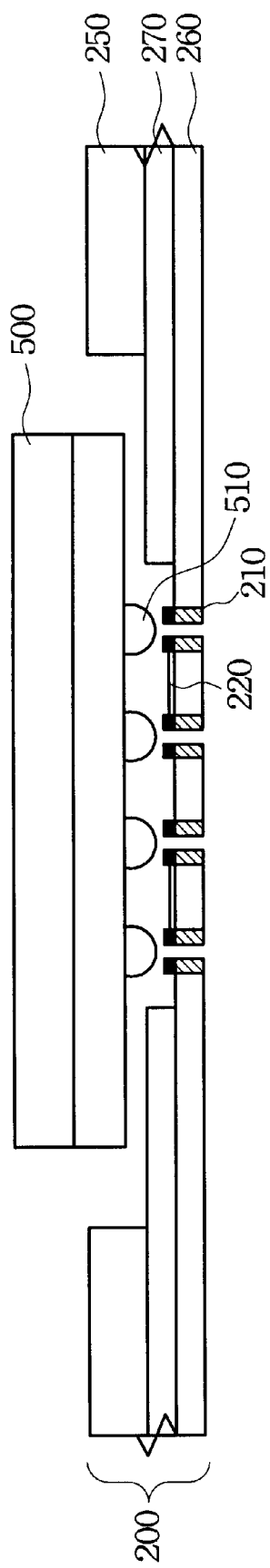
FIG. 4 illustrates the interposer contact with the IC device according to the present invention.

Referring to FIG. 4, the figure shows the cross-sectional view of the interposer contact with the IC device. The interposer 200 comprises a flexible film 260, a higher glass transition temperature $T_g$, and an excellent mechanical property, which is well suited to testing under the high temperature and high frequency. The stiffener 250, made of a temperature-resistant material, is used to uphold the flexible film 260. The contact pads 210 of the flexible film 260 are used to receive the solder balls 510 of the IC device 500. The IC device 500 would be roughly put over the contact pads 210 of the flexible film 260 and precisely guided by a recession of the contact pad 210.

Further, the contact pads 210 on the flexible film 260 are electrically connected to the pads 230 via conductive wires 220, and the pads 230 are next electrically connected to the contact portions 158 of the contact pin 150 as shown in FIG. 3. The compliance is another significant feature of the flexible film 260, which is defined as a characteristic that the solder balls 510 are guided automatically into the contact pads 210 of the flexible film 260, while the IC device 500 is positioning on the flexible film 260. Since each of solder ball 510 is not uniform in size, the contact region, composed of a plurality of contact interfaces, may result in deflection phenomenon on contact region. Such situation will contribute to a variation of electrical properties due to the distinct contact pressure. As a result, the advantage of the compliance for the flexible film 260 is properly adaptive to the different type of the PCB such that the solder balls 510 can be guided automatically by the flexible film 260 to make the contact pressure uniform.

The stop layer 270 is located between the flexible film 260 and the stiffener 250, and buffers the pressure formed by a tight contact when IC device 500 is moving downward. The contact pressure between the solder balls 510 and contact pads 210 may vary from tight to loose to a certain extent. When the IC device 500 the stop layer 270, the contact pressure will be dispersed due to gradually bigger contact region on the flexible film 260 so that the deformation of the solder balls 510 is also much smaller. In other words, the distortion of the solder balls 510 is evidently decreased. The flexible film 260 is partially covered with the stop layer 270 to protect the exposed circuits. In other word, the flexible film 260 can be used as an isolation layer to separate the conductive wire 220 on the flexible film 260.

Figure 5:
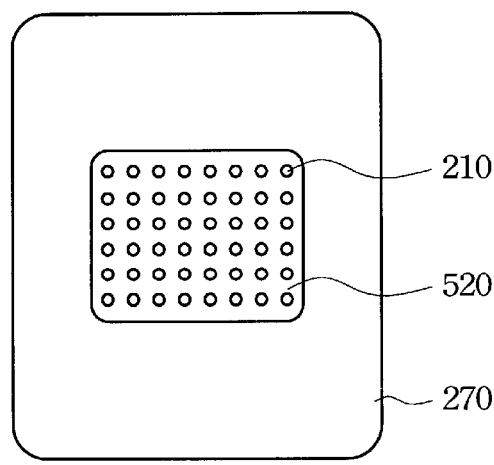
FIGS. 5A~5C illustrates the preferred types of the stop layers according to the present invention.
Figure 5:
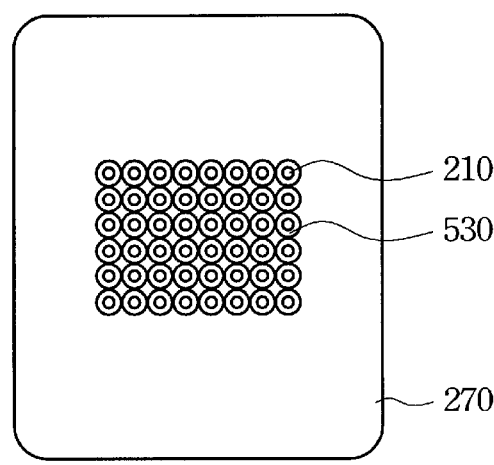
Figure 5:
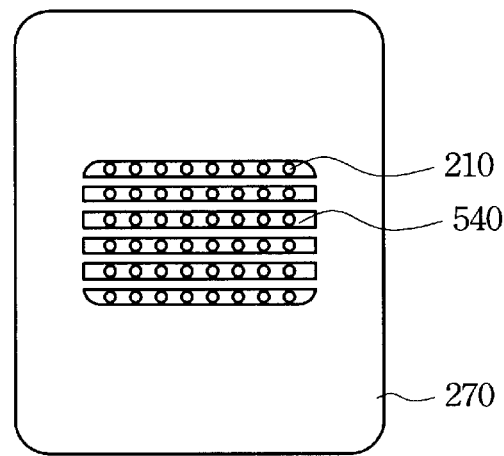

Referring to FIGS. 5A~5D, in the preferred embodiment of the present invention, according to the size of the exposed region on the stop layer 270, the stop layer 270 types comprises three distinct types as follows:

(1) A larger distribution region: As shown in FIG. 5A, the exposed contact region has good compliance because the contact region includes the partial flexible region 520.

(2) A smaller distribution region: As shown in FIG. 5B, the exposed contact region has good uniform pressure onto the contact interface because the contact region merely includes a small area 530 about the adjacent contact pad.

(3) A line distribution region: As shown in FIG. 5C, the exposed contact region has good compliance and uniform a contact pressure because the contact region includes the partial flexible film 260 region in a line area 540 around the contact pads.

Figure 6:
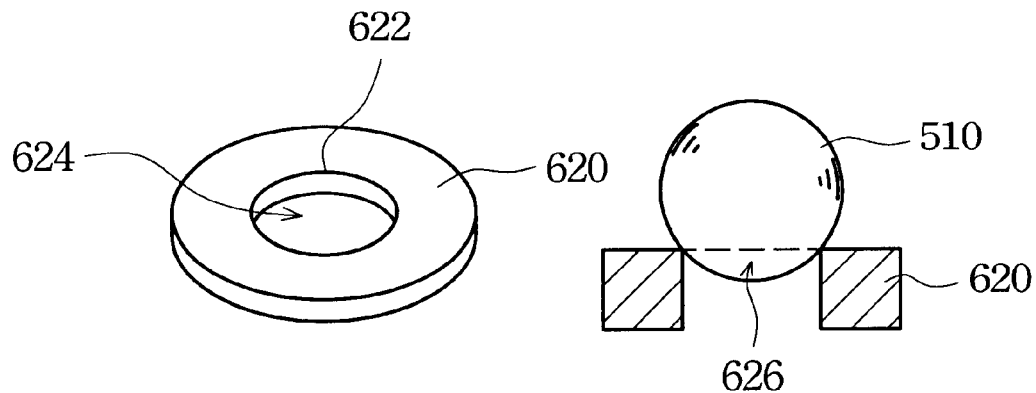
FIGS. 6A~6C illustrates the preferred contact types between a solder ball and a contact pad according to the present invention.
Figure 6:
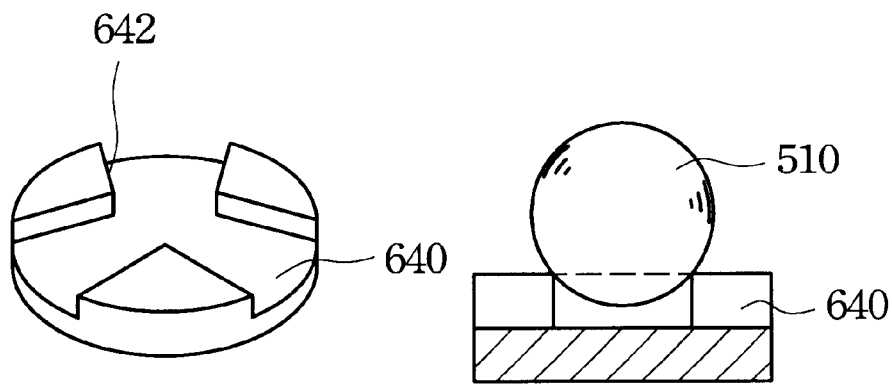
Figure 6:
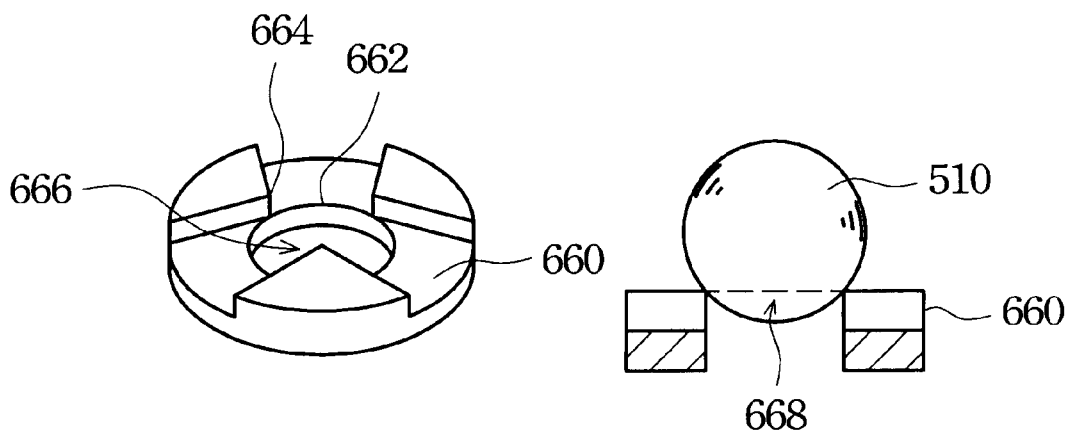

Referring to FIGS. 6A~6C, in the preferred embodiment of the present invention, the types of contact pads 210 on the flexible film 260 comprise three distinct types as follows:

(1) A ring type 620 of contact pad: As shown in FIG. 6A, a ring type 620 of contact pad 210 having a contact arc 622 offers better electrical contact than the conventional pin contact. Further, the ring type having a central through-hole 624 passing through the flexible film 260 can effectively prevent the NDZ 626 of the solder balls 510 from damage.

(2) A bump type 640 of contact pad: As shown in FIG. 6B, a bump type 640 of contact pad 210 has one or a plurality of tips 642, such as three tips preferably. And thus the thin oxide layer on the solder ball 510 can be penetrated with the tips 642 to make current smoothly circulate through the contact region. Moreover, another benefit is that the bump type 640 of contact pad 210 can provide a better compensation of the latitude difference between the solder balls 510 and the contact pads 210.

(3) A ring-bump type 660 of the contact pad: As shown in FIG. 6C, a ring-bump type of the contact pad has a contact arc 662 and one or a plurality of tips 664, such as three tips preferably, used to penetrate the thin oxide layer on the surface of the solder ball 510. Therefore, the electrical contact and the latitude between the solder balls 510 and the contact pad 210 can be greatly improved. Further, the central through-hole reserved for the contact pad 210 can effectively inhibit the NDZ 668 of the solder ball 510 from damage.

All types of contact pad 210 which are mentioned above may dispose on the flexible film 260 or thin film to provide the benefit of the auto-guiding and help the solder balls 510 position rapidly. Any types of contact pad 210, the ring type 620 of contact pad, the bump type 640 of contact pad or the ring-bump type 660 of contact pad, will provide an stable contact effect and automatically guide the solder balls 510 of IC device 500.

(3) The adapter unit 300: Returning to FIGS. 2A to 2D, the element between the interposer 200 and the cover unit 400 is an adapter unit 300. The adapter unit 300 comprises an adapter base 330 (as shown in FIG. 2C), a depressor 310, and a shaft 320 (as shown in FIG. 2B), wherein the adapter base 330 is used to conduct the IC device 500 located in a test area easily and then electrically contact with the interposer 200.

(4) The cover unit 400: The cover unit comprises a cover and springs 410. As described above, the cover unit 500 can move up and down vertically and drive the coupling depressor 310 to press or release the IC device 500. Further referring to FIG. 2C, an upper and a lower position of the cover unit 400 are also shown in this figure. The springs 410 inside the four corner of the cover unit 400 are used to provide the flexibility and force to move the cover unit 400 up and down.

In summary, a IC socket with a contact pad is described in the present invention wherein the type of the contact pad provides a good protection for the solder balls 510 and does not form the deformation of the solder balls 510 to improve the electrical contact. Additionally, the contact type between the solder balls 510 and the contact pad is line contact or partial region contact. Furthermore, the completeness of the NDZ region remains all the time and forms a better contact interface. Moreover, the deformation of the solder balls 510 is smaller than that of the pin contact with convention.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. An integrated circuit (IC) socket, said socket comprising:
   a base unit having a base, a contact pin and an elastomer wherein said elastomer is located at an upper portion of said base and said contact pin is fastened inside a recessed portion of said base;
   an interposer having a flexible film, a stop layer and a stiffener, wherein said flexible film has a contact pad connected a solder ball of a IC device, said stop layer located on said flexible film for buffering pressure formed by a tight contact when said IC device is moving downward, and said stiffener substantially mounted on said stop layer for supporting said flexible film and said stop layer;
   an adapter unit, placed on said base unit and said interposer, having an adapter and a depressor wherein said adapter unit provides the positioning function of said IC device; and
   a cover unit, located over said base, said interposer and said adapter unit, having a cover and a spring wherein said cover coupled to said depressor of said adapter unit is capable of moving up and down vertically.

2. The IC socket of claim 1, wherein said flexible film has compliance such that said solder ball is guided automatically into said contact pad of said flexible film.

3. The IC socket of claim 1, wherein said stop layer is the one selected from a group consisting of a larger distribution region, a smaller distribution region and a line distribution region.

4. The IC socket claim 3, wherein said larger distribution region comprises an exposure of contact region.

5. The IC socket of claim 3, wherein said smaller distribution region comprises an exposure of contact pad region.

6. The IC socket of claim 3, wherein said line distribution region comprises an exposure of contact pad region at a line.

7. The IC socket of claim 1, wherein said contact pad is one type selected from a group consisting of a bump type and a ring-bump type.

8. The IC socket of claim 7, wherein said ring type comprises a through hole having a contact arc to form line contact.

9. The IC socket of claim 7, wherein said bump type comprises a tip or a plurality of tips to penetrate the oxidation layer on the surface of said solder ball.

10. The IC socket of claim 7, wherein said ring-bump type comprises a through hole having a contact arc.

11. The IC socket of claim 7, wherein said ring-bump type comprises a tip or a plurality of tips to penetrate the oxidation layer on the surface of said solder ball.

12. The IC socket of claim 1, wherein said contact pad of said flexible film is electrically connected with said solder ball of said IC device directly.

13. The IC socket of claim 1, wherein said contact pad is a ring type having at least a central hole passing through said flexible film for preventing the solder balls from damage.

* * * * *